United States Patent
Shankar et al.

(10) Patent No.: US 8,106,699 B2
(45) Date of Patent: Jan. 31, 2012

(54) HIGH SIGNAL LEVEL COMPLIANT INPUT/OUTPUT CIRCUITS

(75) Inventors: Vijay Shankar, San Diego, CA (US);
Abheek Gupta, San Francisco, CA (US); Vaishnav Srinivas, San Diego, CA (US); Vivek Mohan, San Digeo, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/181,645

(22) Filed: Jul. 29, 2008

(65) Prior Publication Data
US 2010/0026363 A1 Feb. 4, 2010

(51) Int. Cl.
*H03L 5/00* (2006.01)
(52) U.S. Cl. ............. 327/333; 326/62; 326/80
(58) Field of Classification Search ........... 326/62–63, 326/80–81; 327/306, 333
See application file for complete search history.

(56) References Cited

U.S. PATENT DOCUMENTS

| | | | |
|---|---|---|---|
| 4,506,164 A | 3/1985 | Higuchi | |
| 4,783,603 A | 11/1988 | Goforth et al. | |
| 4,949,139 A | 8/1990 | Korsh et al. | |
| 5,218,682 A | 6/1993 | Frantz | |
| 5,511,170 A | 4/1996 | Abdoo | |
| 5,559,464 A | 9/1996 | Orii et al. | |
| 5,631,629 A | 5/1997 | Fooks et al. | |
| 5,642,321 A | 6/1997 | McAdams | |
| 5,644,265 A | 7/1997 | Austin et al. | |
| 5,734,914 A | 3/1998 | Nakamura et al. | |
| 5,793,987 A | 8/1998 | Quackenbush et al. | |
| 5,825,205 A | 10/1998 | Ohtsuka | |
| 5,896,045 A | 4/1999 | Siegel et al. | |
| 5,907,464 A | 5/1999 | Maloney et al. | |
| 5,986,472 A | 11/1999 | Hinedi et al. | |
| 6,101,566 A | 8/2000 | Woods et al. | |
| 6,147,540 A | 11/2000 | Coddington | |
| 6,163,824 A | 12/2000 | Quackenbush et al. | |
| 6,211,698 B1 | 4/2001 | Suh | |
| 6,226,700 B1 | 5/2001 | Wandler et al. | |
| 6,279,060 B1 | 8/2001 | Luke et al. | |
| 6,377,086 B1 | 4/2002 | Bays et al. | |

(Continued)

FOREIGN PATENT DOCUMENTS

EP 0774838 A1 5/1997

(Continued)

OTHER PUBLICATIONS

International Search Report-PCT/US09/051395, International Search Authority-European Patent Office-Oct. 28, 2009.

(Continued)

*Primary Examiner* — Dinh T. Le

(74) *Attorney, Agent, or Firm* — Sam Talpalatsky; Nicholas J. Pauley; Jonathan T. Velasco

(57) ABSTRACT

A level shifter has at least one of either a pull up or a pull down circuit. The circuit is made of electronic components with reliability limits less than a maximum signal level output by the level shifter. The level shifter also has a timing circuit coupled to at least on of either the pull up or pull down circuit. The timing circuit controls a time of application of an input signal to at least one of either the pull up or pull down circuit preventing a terminal to terminal signal level experienced by the electronic components exceeding the reliability limits.

21 Claims, 10 Drawing Sheets

U.S. PATENT DOCUMENTS

| | | | |
|---|---|---|---|
| 6,378,082 B1 | 4/2002 | Rajappa et al. | |
| 6,433,579 B1 * | 8/2002 | Wang et al. | 326/38 |
| 6,460,102 B1 | 10/2002 | Choi | |
| 6,462,554 B2 | 10/2002 | Brown | |
| 6,490,708 B2 | 12/2002 | Cohn et al. | |
| 6,496,054 B1 | 12/2002 | Prather et al. | |
| 6,724,226 B2 | 4/2004 | Kim | |
| 6,762,619 B2 | 7/2004 | Nakada et al. | |
| 6,778,930 B2 | 8/2004 | Sugawara et al. | |
| 6,791,373 B2 | 9/2004 | Oyama | |
| 6,859,082 B2 * | 2/2005 | Tang | 327/276 |
| 6,873,503 B2 | 3/2005 | Amick et al. | |
| 6,928,562 B2 | 8/2005 | Cohen et al. | |
| 6,987,412 B2 | 1/2006 | Sutherland et al. | |
| 7,026,847 B2 * | 4/2006 | Wang et al. | 327/112 |
| 7,157,947 B2 | 1/2007 | Chansungsan et al. | |
| 7,185,135 B1 | 2/2007 | Briggs et al. | |
| 7,209,332 B2 | 4/2007 | Stockinger et al. | |
| 7,236,002 B2 | 6/2007 | Salzmann et al. | |
| 7,276,957 B2 | 10/2007 | Bhattacharya et al. | |
| 7,310,695 B2 | 12/2007 | Epps et al. | |
| 7,397,273 B1 | 7/2008 | Ng et al. | |
| 7,521,970 B2 | 4/2009 | Gupta et al. | |
| 7,554,379 B2 | 6/2009 | Pilling et al. | |
| 7,679,418 B2 * | 3/2010 | Vlasenko | 327/333 |
| 2006/0277346 A1 | 12/2006 | Doak et al. | |
| 2007/0021838 A1 | 1/2007 | Dugas et al. | |
| 2007/0030035 A1 | 2/2007 | Komatsu et al. | |
| 2007/0057694 A1 | 3/2007 | Salzmann et al. | |
| 2007/0279096 A1 | 12/2007 | Chong et al. | |

FOREIGN PATENT DOCUMENTS

| | | |
|---|---|---|
| EP | 0859469 | 8/1998 |
| EP | 0889592 A2 | 1/1999 |
| WO | WO9642139 | 12/1996 |
| WO | WO2005107074 | 11/2005 |
| WO | 07073767 | 7/2007 |

OTHER PUBLICATIONS

Written Opinion-PCT/US09/051395, International Search Authority-European Patent Office-Oct. 28, 2009.

USB Implementers Group "Universal Serial Bus Specification" Revision Apr. 2, 2000, USB Implementers Group, pp. 15-24, 119-152.

* cited by examiner

HIGH SIGNAL LEVEL COMPLIANT INPUT/OUTPUT CIRCUITS

CROSS-REFERENCE TO RELATED APPLICATIONS

This application is related to the following U.S. patent applications, filed concurrently herewith: U.S. patent application Ser. No. 12/181,621 filed Jul. 29, 2008 and entitled "HIGH SIGNAL LEVEL COMPLIANT INPUT/OUTPUT CIRCUITS"; U.S. patent application Ser. No. 12/181,633 filed Jul. 29, 2008 and entitled "HIGH SIGNAL LEVEL COMPLIANT INPUT/OUTPUT CIRCUITS"; U.S. patent application Ser. No. 12/181,655 filed Jul. 29, 2008 and entitled "HIGH SIGNAL LEVEL COMPLIANT INPUT/OUTPUT CIRCUITS"; U.S. patent application Ser. No. 12/181,672 filed Jul. 29, 2008 and entitled "HIGH SIGNAL LEVEL COMPLIANT INPUT/OUTPUT CIRCUITS"; the disclosures of which are expressly incorporated by reference herein in their entireties.

TECHNICAL FIELD

The present disclosure relates generally to input/output circuits and, more particularly, to input/output circuits compatible with high signal levels.

BACKGROUND

The use of various electronic devices has become nearly ubiquitous in modern society. For example, desk top and portable electronic devices are typically used daily by office workers and professionals in performing their work. It is not uncommon for such persons to regularly use electronic devices such as personal computer systems, personal digital assistants (PDAs), cellular telephones, pagers, digital sound and/or image recorders, etc. It is not uncommon for such electronic devices to be used in combination with one or more peripherals, such as an external display device, a memory device, a printer, a docking station, a network interface, etc. However, in order to properly interface with a peripheral, not only should the electronic device provide the appropriate physical connection and underlying interfacing protocols, but the electronic device typically must accommodate the signal levels (e.g., voltage levels) native to the peripheral interface.

It is not uncommon for different peripherals to utilize different signal levels at their associated peripheral interface. For example, a memory device provided by a particular manufacturer and/or operating in accordance with a particular standard may utilize peripheral interface signal levels on the order of 1.8V, whereas a similar memory device provided by a different manufacturer and/or operating in accordance with a different standard may utilize peripheral interface signal levels on the order of 2.6V or 3.0V. Although the foregoing example may not initially appear to be a large difference in signal level, electronic components may experience reliability (the capability of the component to operate without degraded performance over a long period of time) issues if designed for a lower signal level, such as 1.8V, and operated with a higher signal level, such as 2.6V or 3.0V.

The reliability of individual electronic components, such as transistors, can be compromised in many ways, such as electrical stress caused by prolonged application of electric fields across the terminals of the transistor. As these electric fields become higher, the lifetime of the electronic component is reduced. By way of example, the reliability limits for metal oxide on silicon (MOS) transistors depend on different breakdown phenomena including time dependent dielectric breakdown (TDDB), hot carrier injection (HCI), and negative bias temperature instability (NBTI). The reliability limits associated with each of the foregoing phenomenon for 45 nm MOS (1.8V) electronic components are provided in the table below. From this table, it can readily be appreciated that operation of such electronic components using signal levels of 2.6V or 3.0V are likely to present reliability issues.

| Phenomenon | 45 nm (1.8 V thick oxide device) | Maximum Voltage (V) |
| --- | --- | --- |
| TDDB | NMOS | 2.7 |
|  | PMOS | 2.7 |
| HCI | NMOS | 2.0 |
|  | PMOS | 2.2 |
| NBTI | PMOS | 2.0 |

Various techniques have been employed in attempting to accommodate peripherals having different signal levels associated therewith. FIG. 1 shows exemplary prior art electronic device 100 having a plurality of input/output circuits, each configured to accommodate a particular signal level. Input/output circuit 120, for example, may comprise electronic components designed to accommodate a first signal level (e.g., 1.8V), whereas input/output circuit 130 may comprise electronic components designed to accommodate a second signal level (e.g., 2.6V). That is, circuitry of output path 121 and circuitry of input path 122 may be adapted to reliably operate with peripherals interfacing using 1.8V signals. Circuitry of output path 131 and circuitry of input path 132 may thus be adapted to reliably operate with peripherals interfacing using 2.6V signals. Host circuitry 101, such as may provide core operating functions of device 100, may be adapted to interface with input/output circuits 120 and 130 using respective signal levels.

The technique for accommodating peripherals having different signal levels shown in FIG. 1 presents issues with respect to size and cost. Specifically, the illustrated embodiment provides for two separate input/output circuits, thus requiring additional physical area to house the circuitry. Moreover, costs associated with added components are incurred in the illustrated technique.

Another technique for accommodating peripherals having different signal levels is to utilize input/output circuitry, such as input/output circuitry 130 of FIG. 1, designed to accommodate a higher signal level (e.g., 2.6V) both with peripherals interfaced using the higher signal level and peripherals interfaced using a lower signal level (e.g., 1.8V). Operating electronic devices with an electronic field lower than that the device is designed for will typically not result in the foregoing reliability issues. However, the use of circuitry designed for higher signal levels is generally not energy efficient and also degrades performance. Specifically, utilizing electronic components which are designed to accommodate higher signal levels in processing lower signal levels generally consumes more energy than utilizing appropriately designed electronic components.

Electronic devices today are becoming smaller and power management is becoming vital. For example, in order to maximize battery life in a portable device, even relatively small savings in power consumption can be important. Thus, utilizing input/output circuitry designed to accommodate higher signal levels when processing lower signal levels, although typically not providing reliability issues, results in undesired power consumption.

BRIEF SUMMARY

This application discloses a level shifter having at least one of either a pull up or a pull down circuit. The circuit is made of electronic components with reliability limits less than a maximum signal level output by the level shifter. The level shifter also has a timing circuit coupled to at least on of either the pull up or pull down circuit. The timing circuit controls a time of application of an input signal to at least one of either the pull up or pull down circuit preventing a terminal to terminal signal level experienced by the electronic components exceeding the reliability limits.

This application also discloses a level shifter having level shifting circuitry to selectively level shift an input signal to a first signal level and a second signal level depending on a mode of operation. The first signal level is less than the second signal level. The electronic components have reliability limits less than the second signal level. The level shifter also has a timing circuit coupled to the level shifting circuitry to control a time of application of an input signal to the level shifting circuitry preventing a terminal to terminal signal level experienced by the electronic components from exceeding the reliability limits.

This application also discloses a method including providing level shifting circuitry to selectively level shift an input signal to a first signal level and a second signal level depending on mode of operation. The first signal level is less than the second signal level, and the electronic components have reliability limits less than the second signal level. The method also includes coupling a timing circuit to the level shifting circuitry and adapting the timing circuitry to control a time of application of an input signal to level shifting circuitry. This prevents a terminal to terminal signal level experienced by the electronic components from exceeding the reliability limit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
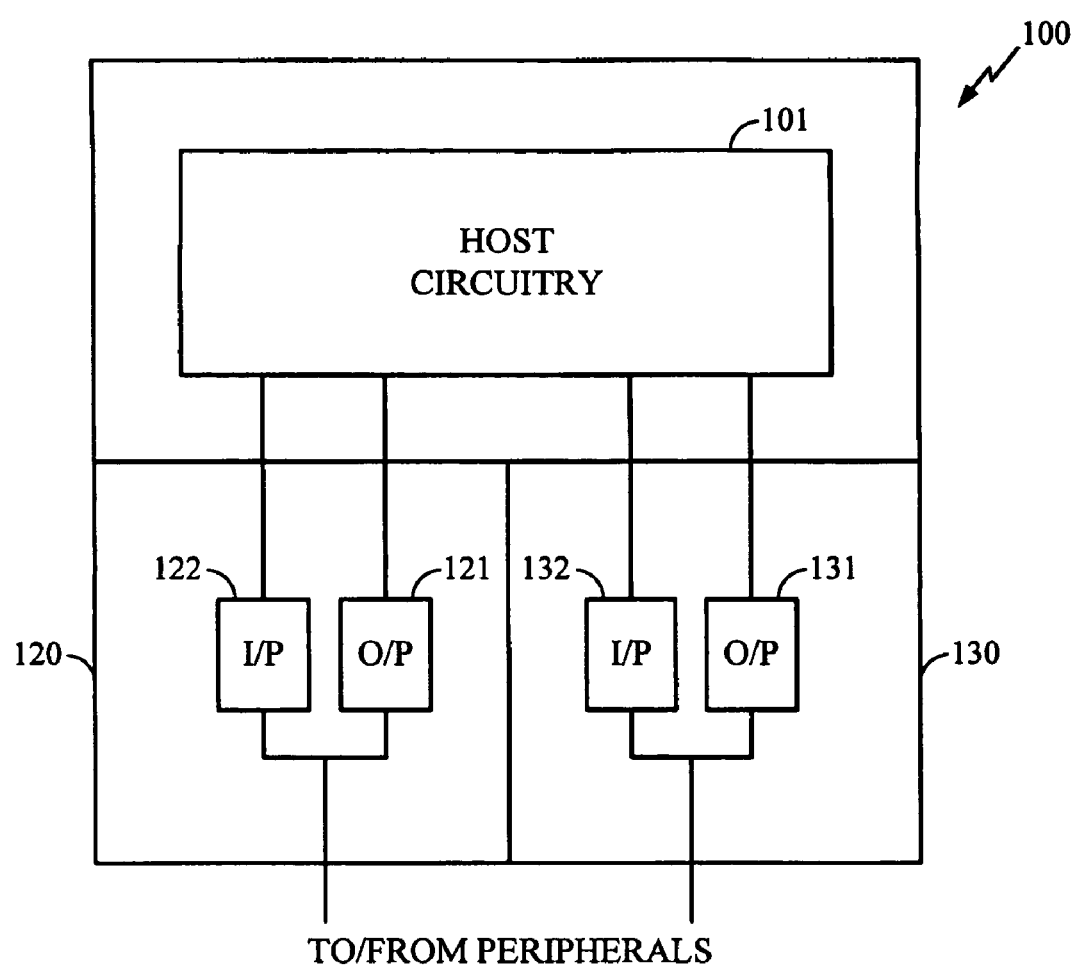
FIG. 1 shows a prior art electronic device having a plurality of input/output circuits, each configured to accommodate a particular signal level.
Figure 2:
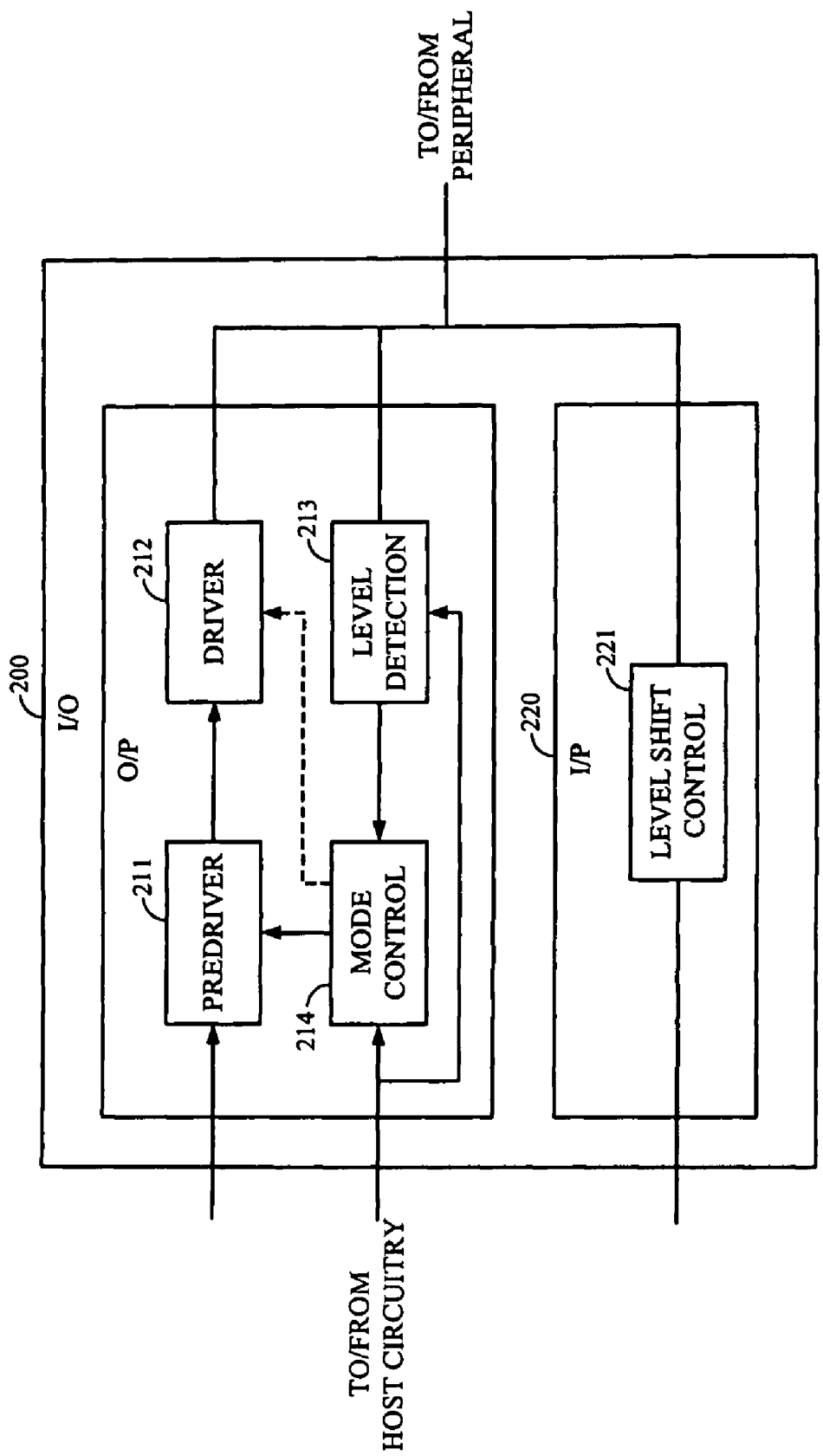
FIG. 2 shows a high level block diagram of an embodiment of high signal level compliant input/output circuitry.

FIG. 2 shows a high level block diagram of an embodiment of high signal level compliant input/output circuitry according to the concepts herein. Input/output circuit 200 of FIG. 2 is adapted to provide interfacing between host circuitry (not shown) of a host electronic device, such as a personal computer system, personal digital assistant (PDA), cellular telephone, pager, digital sound recorder, digital camera, digital video camera, personal entertainment player, gaming device, etc., and a peripheral, such as a memory device, a display, a printer, an electronic pointer, a transducer, etc. In particular, input/output circuit 200 is adapted to accommodate peripheral interface signals of both high level (e.g., 2.6V and/or 3.0V) and of low level (e.g., 1.8V). In accommodating high signal levels, input/output circuit 200 utilizes electronic components designed for use with respect to the low signal levels. Embodiments thereby provide efficiencies with respect to size and power consumption. As will better be appreciated from the discussion below, in accommodating high signal levels using electronic components designed for low signal levels, input/output circuit 200 is adapted to avoid reliability issues associated with application of relatively large electric fields across the terminals of the electronic components.

Input/output circuit 200 shown in FIG. 2 comprises output path 210 for interfacing signals from circuitry of a host device to circuitry of a peripheral and input path 220 for interfacing signals from circuitry of the peripheral to circuitry of the host device. Although input/output circuit 200 of the illustrated embodiment comprises both output path 210 and input path 220, embodiments may implement concepts as described herein in input path circuitry alone or output path circuitry alone. Moreover, concepts described herein are applicable to circuitry in addition to input and output circuitry, and thus embodiments may be provided consistent with the teachings herein in numerous situations where signal levels higher than particular electric components are designed to operate with are to be accommodated.

Output path 210 and input path 220 of the illustrated embodiment are each adapted to accommodate both high level (e.g., 2.6V or 3.0V) and low level (e.g., 1.8V) signals. In particular, and as described in detail below, input path 220 includes level shift control 221 comprised of electronic components designed for low signal levels and adapted to reliably operate with respect to both low level and high level signals provided by peripherals coupled thereto. Similarly, and as described in detail below, output path 210 includes predriver 211 coupled to driver 212, each comprised of electronic components designed for low signal levels and adapted to reliably operate with respect to both low level and high level signals provided to peripherals coupled thereto. Mode control 214 of the illustrated embodiment is coupled to predriver 211, and in some embodiments to driver 212, to provide control of circuitry therein for low and high signal level operation.

In operation according to particular embodiments, input/output circuit 200 is adapted to interact with circuitry of a host device using a predetermined low signal level and to interact with circuitry of peripheral devices using a signal level appropriate to the particular peripheral device currently interfaced. In many configurations, circuitry of the host system will perform power saving operation, such as to shutdown one or more power supply outputs (e.g., the core voltage). In order to accommodate such power saving operation without resulting in an ambiguous state of input/output circuit operation, mode control 214 of embodiments includes internal control signal generation utilized during periods of host circuitry power saving operation. That is, when one or more output of the host circuitry is unavailable due to power saving operation, mode control 214 of embodiments operates to internally generate appropriate control of predriver 211 and/or driver 212 to keep that circuitry latched in a selected low or high signal level state. Thus, when the host circuitry is returned to an operational state from power saving operation, input/output circuit 200 is configured to continue interfacing with the peripheral.

Input/output circuit 200 illustrated in FIG. 2 is versatile in that it is operable to automatically and autonomously configure itself for operation with respect to an appropriate signal level. That is, input/output circuit 200 of the illustrated embodiment is adapted to automatically select low signal level operation or high signal level operation as appropriate. Accordingly, level detection 213 of output path 210 is coupled to a peripheral for which interfacing is being provided to detect a signal level thereof and provide a mode selection signal to mode control 214. Mode control 214 may thus provide control with respect to circuitry of predriver 211 and/or driver 212 in accordance with a mode (e.g., low signal level or high signal level) indicated by level detection 213. Level shift control 221 of input path 220 in the illustrated embodiment is operable to compensate for high signal level operation without a mode control signal.

Having described operation of input/output circuit 200 of the illustrated embodiment at a high level, the individual functional blocks according to embodiments are described in detail below. It should be appreciated that the particular embodiments described herein are exemplary embodiments and that the concepts described may be implemented in embodiments in addition to or in the alternative to those shown.

Figure 3:
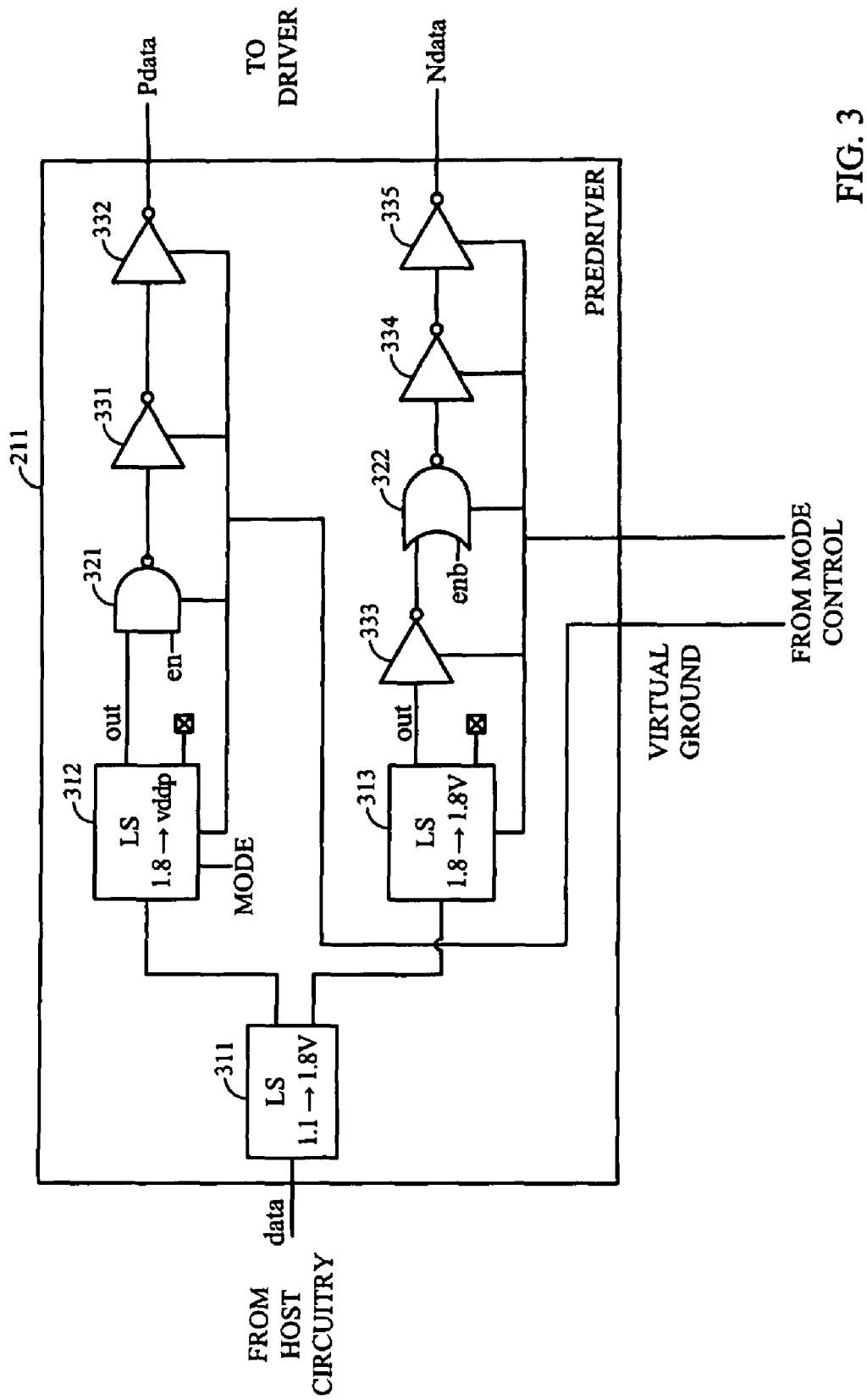
FIG. 3 shows detail with respect to an embodiment of a predriver as may be used in the high signal level compliant input/output circuitry of FIG. 2.

Directing attention to FIG. 3, detail with respect to an embodiment of predriver 211 is shown. Predriver 211 of the illustrated embodiment accepts input of a data signal from host circuitry directed to an interfaced peripheral, provides level shifting of the data signal from a signal level internal to the host device to a signal level appropriate for the particular peripheral interfaced, and provides outputs to drive driver 212 to provide data output to the peripheral at the appropriate signal level. To provide the foregoing operation, predriver 211 of the illustrated embodiment includes level shifters 311-313 and buffers 331-335. Level shifters 311-313 operate to provide data signal level shifting from a level provided by host circuitry to a level appropriate for circuitry of an interfaced peripheral, such as in accordance with a mode selection signal provided by mode control 214. Buffers 331-335 operate to provide data signal buffering to result in a data signal suitable for appropriately driving driver 212. Logic gates 321 and 322 are provided in the illustrated embodiment to facilitate controllable enabling and disabling the output of predriver 211. Specifically, application of appropriate enable signals to terminals of logic gate 321 (here a NAND gate) and logic gate 322 (here a NOR gate) operates to selectively enable/disable output of predriver 211.

In accommodating signal levels higher than those for which electronic components of predriver 211 are designed, predriver 211 utilizes a non-zero signal level (e.g., core voltage of 1.1V) as a bias supply voltage (e.g., provided as virtual ground) when processing higher signal levels (e.g., pad voltages of 2.6V and 3.0V). Accordingly, level shifting of predriver 211 of the illustrated embodiment is provided in multiple stages. Specifically, level shifter 311 operates to level shift a data signal from host circuitry provided at a signal level internal to the host device (e.g., a core voltage such as 1.1V) to the lowest peripheral signal level accommodated (e.g., shown here as the 1.8V pad voltage). Level shifter 312 disposed in the pdata path of predriver 211 operates to level shift (if needed) the data signal as output by level shifter 311 to a level appropriate to the peripheral interfaced (e.g., a pad voltage of 2.6V or 3.0V). Where the interfaced peripheral operates with respect to the lowest peripheral signal level accommodated (shown here as 1.8V), level shifter 312 of the illustrated embodiment does not provide level shifting and effectively operates as a delay device.

In the 2.6/3.0V mode of operation (as may be selected by the mode signal received from mode control 214), the input of level shifter 312 of the illustrated embodiment toggles between 0V and 1.8V while the level-shifted output toggles between 1.1V and 2.6V or 3.0V. During the 1.8V mode of operation (as may be selected by the mode signal received from mode control 214), level shifter 312 of the illustrated embodiment does not perform a level translation and the output levels remain the same as the input levels (between 0V and 1.8V). The level shifter thus translates its input signals to levels which are consistent from a reliability point of view for the given mode of operation, as will be better understood from the discussion of an embodiment of level shifter circuitry shown in FIG. 4 below.

In addition to operating to maintain good reliability levels for the electronic components therein, it is desirable to provide good switching performance with respect to the data path. For example, the signals provided by predriver 211 operate to control electronic components of driver 212 to pull up to a data high level (e.g., 1.8V, 2.6V, or 3.0V using predriver 211 output pdata) and to control electronic components of driver 212 to pull down to a data low level (e.g., 0V using predriver 211 output ndata). Accordingly, embodiments operate to terminate a high or driving signal at one of the predriver outputs (pdata or ndata) before initiating a high or driving signal at the other one of the predriver outputs (ndata or pdata), thereby establishing "break-before-make" switching control of driver 212. Such switching control avoids ambiguity with respect to the data output as well as avoiding undesired standby current in driver 212.

The foregoing switching performance is achieved according to the illustrated embodiment by matching the signal propagation delay associated with the pdata and ndata paths in predriver 211. For example, although level shifting beyond that provided by level shifter 311 is not needed in the ndata path of predriver 211, level shifter 313 is provided in the ndata path to provide delay matching between the pdata path and the ndata path of predriver 211. That is, the illustrated embodiment of level shifter 313 operates to both accept and output signal levels at the lowest peripheral signal level accommodated (here the 1.8V pad voltage) without level shifting the signal, but provides a propagation delay useful for matching the total delays of the pdata and ndata paths. The use of additional elements, such as an additional inverter in the output chain of the ndata path (e.g., inverters 333-335 in the ndata path as compared to inverters 331 and 332 in the pdata path) may additionally or alternatively be used for the foregoing delay matching. Delay matching ensures a good duty cycle for the final output signal. The delay can be programmed in each component of the ndata path based upon a mode signal received from mode control 214. From the above is should be appreciated that low signal levels (e.g., 1.8V) are sufficient to provide switching off with respect to driver 212, and thus the ndata path of the illustrated embodiment does not operate at the higher signal level (e.g., 2.6V or 3.0V) regardless of the particular mode output path 210 is operating in.

A virtual ground signal provided to the pdata path of predriver 211 is controlled by mode control 214, i.e., based upon whether the system is in the 1.8V, 2.6V, or 3.0V mode of operation according to embodiments. In one embodiment, a 0V ground is provided when the system is connected to a 1.8V peripheral and a 1.1V ground is provided when the system is operating with 2.6V or 3.0V peripherals.

Figure 4:
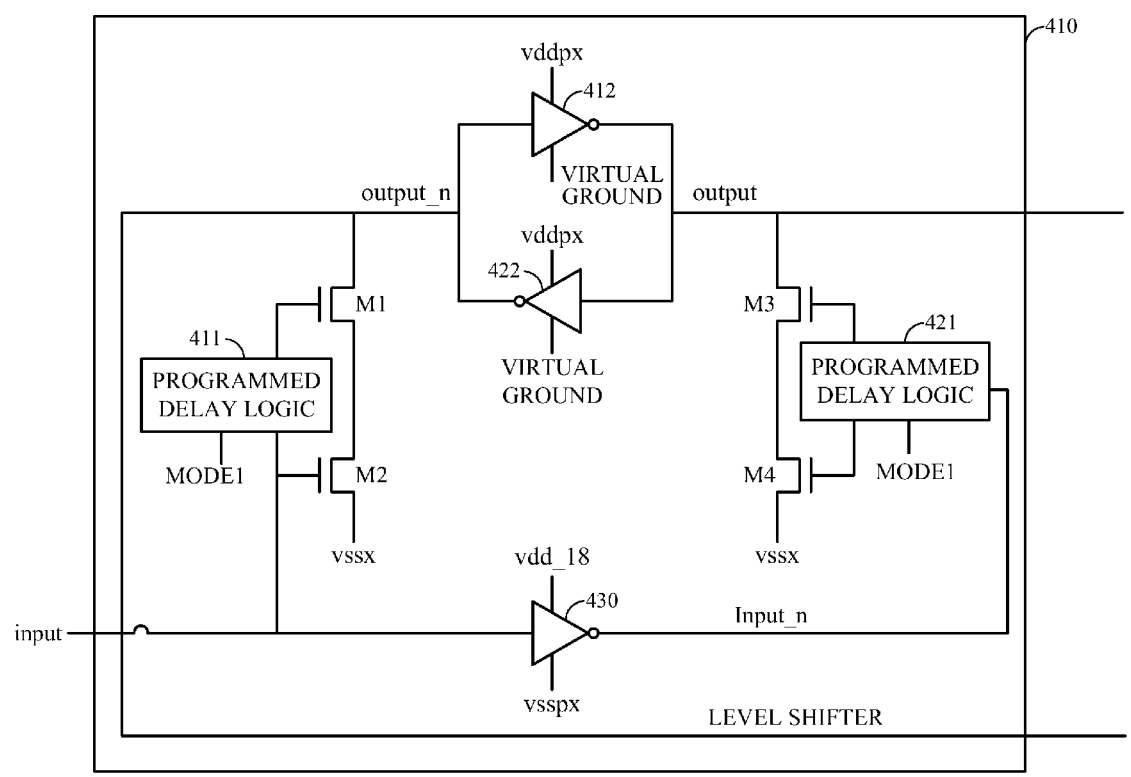
FIG. 4 shows detail with respect to an embodiment of a level shifter as may be used in the predriver of FIG. 3.

Directing attention to FIG. 4, details with respect to an embodiment of a level shifter as may be utilized in providing the level shifter 312 are shown. Level shifter 410 shown in FIG. 4 provides a timing based level shifter configuration to accommodate signal levels higher than electronic components thereof are designed to reliably operate with. The configuration does not compromise the reliability of the electronic components of level shifter 410.

In operation, a digital level shifter such as level shifter 410 converts a full-swing digital input between ground and a power supply level to a full-swing digital output that swings between ground and a different power supply level. Ideally, the level shifter circuit retains the phase information from the input signal to the output signal. Voltage level shifters utilized by input/output circuits typically shift signals from a core voltage (e.g., 1.1V) to a single pad voltage (e.g., either 1.8 V, 2.6V, or 3.0 V). Accordingly, in the case of a core voltage of 1.1V and a pad voltage of 2.6V or 3.0V, the voltage level shifting provided is from 1.1V to 2.6V or 3.0V, respectively. However, for purposes of meeting reliability limits of electronic components designed to operate with respect to 1.8V (e.g., 45 nm 1.8V transistors), terminals of these electronic components (e.g., the gate of a transistor) should not be allowed to toggle between 0 and 2.6V or 3.0V. Accordingly, in operation according to the illustrated embodiment, the two stage level shifting configuration of FIG. 3 results in level shifters 311 and 313 operating to toggle their output between 0V and 1.8V and level shifter 312 operating to toggle its output between 0V and 1.8V (in 1.8V mode) and 1.1V and 2.6V or 3.0V (in 2.6V or 3.0V mode). In the 2.6V mode, for example, level shifter 410 level shifts signals from 1.8V (shown as vdd_18) to 2.6V (shown as vddp) and from 0V (shown as vssx) to 1.1V (shown as vddc).

The mode in which level shifter 410 of this illustrated embodiment operates is controlled using the virtual ground signal provided by mode control 214. In 2.6V mode, for example, virtual ground is set to 1.1V, whereas in 1.8V mode virtual ground is set to 0V. It should be appreciated that the high level voltage (shown as vddp) used by components of level shifter 312, as well as other components of input/output circuit 200, changes in each mode (e.g., 1.8V in 1.8V mode or 2.6V in 2.6V mode) as a result of that pad voltage being used by the interfaced peripheral. For example, where the interfaced peripheral provides the pad voltage, this voltage changes as a result of the peripheral having been interfaced. Where the host circuitry provides the pad voltage, this voltage changes as a result of the host circuitry being configured to interface with the peripheral. For example, versatile circuitry, such as level detection 213, may be utilized in combination with the host circuitry to automatically and autonomously provide selection of an appropriate pad voltage by the host circuitry. Alternatively, the host circuitry may be manually switched to provide a pad voltage appropriate to a particular interfaced peripheral.

In 2.6V mode, when the input to level shifter 410 is 1.8V, transistors M2 and M1 (shown here as field effect transistors (FETs), more specifically, NFETS) are turned ON and transistors M4 and M3 (also shown as NFETs) are turned OFF. In operation, the gate voltage to transistor M1 is HIGH (1.8 v input to level shifter 410) for a certain time "d" and then goes low turning the transistor OFF. The delay "d" is provided by programmable delay logic 411 providing a selected delay that is long enough to pull down the voltage at node output_n below vddc (core voltage of 1.1V), but that is short enough to avoid pulling the voltage at node output_n all the way down (0V). Thus, the voltage at node output goes to 2.6V (pad voltage vddp) and the voltage at node output_n goes to 1.8V.

Conversely to the foregoing operation, when the input to level shifter 410 is 0V, transistors M4 and M3 are turned ON (note inverter 430 disposed between the input to level shifter 410 and transistors M3 and M4) and transistors M2 and M1 are turned OFF. The gate voltage to transistor M3 is HIGH (0 v input to level shifter 410) for time 'd' and then goes low turning the transistor OFF. The delay 'd' is provided by programmable delay logic 421, such as circuitry corresponding to that of programmable delay logic 411, providing a selected delay that is long enough to pull down the voltage at node output below vddc (core voltage of 1.1V), but that is short enough to avoid pulling the voltage at node output all the way down (0V). Thus, the voltage at node output_n goes to 2.6V (pad voltage vddp) and the voltage at node output goes to 1.8V.

Relative sizing of the components of the pull down stacks and inverters controls to what levels the voltage nodes output and output_n are pulled down. For example, the voltage to which nodes output and output_n are pulled down to may be controlled by appropriately sizing electronic components of inverters 412 and 422 and the transistors of the corresponding pull down stack (transistors M1 and M2 for inverter 412 and transistors M3 and M4 for inverter 422). The main function of transistors M1 and M2 are to pull down sufficiently to write into the latch 412, 422. Similarly, transistors M3 and M4 have the same function.

The foregoing timing based operation of level shifter 410 avoids exposing terminals of M1 and inverter 412 (e.g., a gate of a P-type FET (PFET) to the full pad voltage (e.g., vddp=2.6V) as would happen if output_n was pulled to 0V. This timing based operation avoids reliability issues because the full pad voltage, which is larger than what the electronic components can reliably withstand, is never present across the terminals of the electronic components.

In the 1.8 V mode, level shifter 410 of the illustrated embodiment does not perform level shifting of voltage levels but instead acts like a buffer. In this mode, where virtual ground is 0V, the delay logic of programmable delay logic 411 and 421 does not generate a time-shifted pulse but instead follows the input. Therefore, when the input to level shifter 410 is 1.8V, transistors M1 and M2 are both turned ON (transistors M3 and M4 are both turned OFF) and remain ON as long as the input is HIGH. Similarly, when the input to level shifter 410 is 0V, transistors M3 and M4 are both turned ON (transistors M1 and M2 are both turned OFF) and remain ON as long as the input is LOW. This continuous operation is permitted because there are no reliability restrictions as both the inputs and outputs toggle between 1.8V and 0V only.

Figure 5:
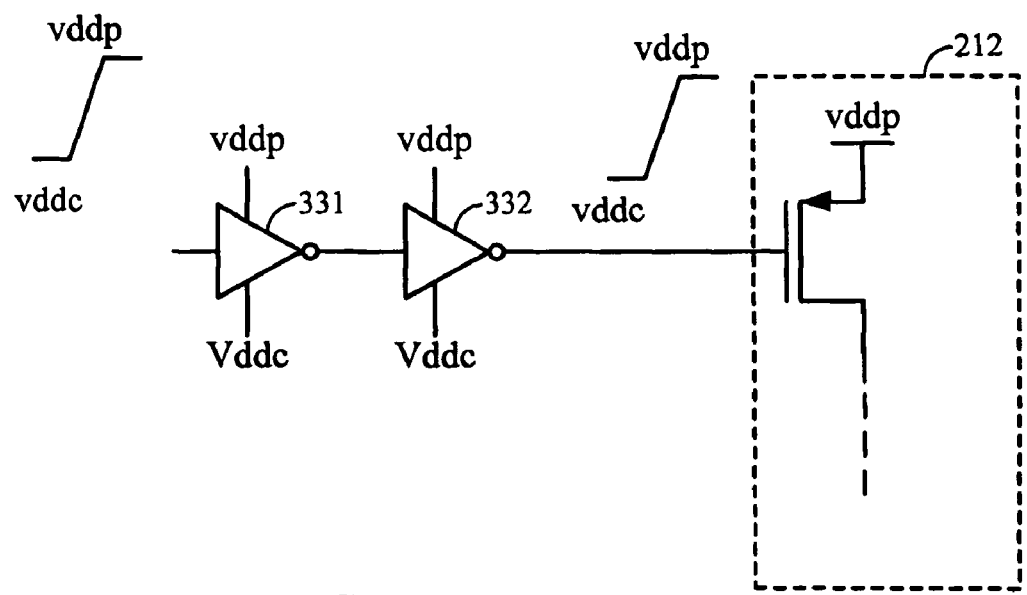
FIG. 5 shows detail with respect to an embodiment of tapered buffers as may be used in the predriver of FIG. 3.

Having described operation of level shifters as may be utilized in embodiments of predriver 211, attention is again directed toward FIG. 3. As previously mentioned, predriver 211 of the illustrated embodiment includes buffers 331-335 to provide data signal buffering in order to result in a data signal suitable for appropriately driving driver 212. Buffering according to embodiments is performed by tapered buffers which toggle between a virtual ground (e.g., core voltage vddc of 1.1V) and the pad voltage (e.g., vddp of 2.6V) as shown in FIG. 5. During 1.8V mode, the tapered buffers toggle between 0V and 1.8 V. Each buffer in a chain (e.g., buffers 331-332 and buffers 333-335) provides sufficient buffering (e.g., is comprised of larger transistors) to thereby step up the drive of the level shifted signal in order to sufficiently drive electronic components of the much larger driver 212.

Referring again to FIG. 2, it can be seen that the output of predriver 211 is coupled to the input of driver 212 according to the illustrated embodiment. As discussed above, the buffered, level shifted signals output by predriver 211 are provided to driver 212 for driving a signal to an interfaced peripheral at an appropriate signal level.

Figure 6:
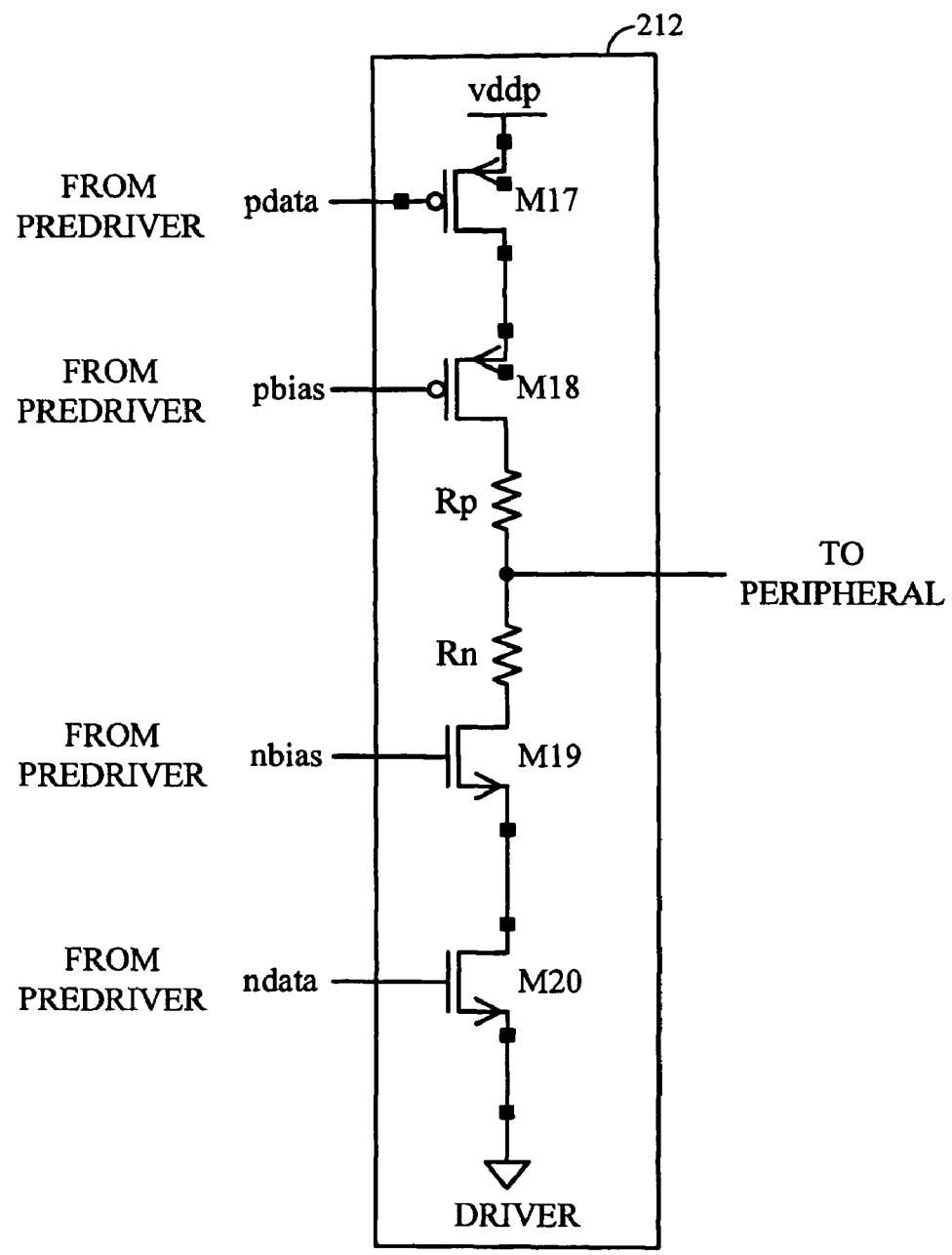
FIG. 6 shows detail with respect to an embodiment of a driver as may be used in the high signal level compliant input/output circuitry of FIG. 2.

FIG. 6 shows detail with respect to an embodiment of driver 212. The illustrated embodiment of driver 212 employs a stacked device driver strategy. Such a stacked driver configuration facilitates use of electronic components designed for a lower signal level being operated with a higher signal level without presenting reliability issues, such as to avoid the HCI breakdown phenomena as discussed below. Moreover, the stacked driver configuration facilitates electrostatic discharge (ESD) protection, such as by preventing snapback in driver FETs.

The stacked driver structure shown in FIG. 6 provides the pdata signal from predriver 211 to transistor M17 (here a PFET), whose source is tied to Vddp, whereas transistor M18 (here also a PFET) whose drain is closer to the output is controlled by a bias voltage pbias. During pull up, there is a small duration of time during which transistor M17 is not fully turned ON and thus transistor M18 would experience a higher voltage across its drain and source terminals, potentially causing a transient HCI issue. However, in avoiding the forgoing HCI issue, the drain of transistor M18 is coupled to the output node through resistor Rp. The use of resistor Rp reduces the transient Vds overshoot of transistor M18, thereby keeping the voltages across its terminals within reliability limits.

Although the upper half of the exemplary circuitry of driver 212, used for providing the data high portion of signal output, has been described above, it should be appreciated that the lower half of driver 212, used for providing the data low portion of signal output, works similarly. Specifically, the ndata signal from predriver 211 is provided to transistor M20 (here an NFET), whose source is tied to ground, whereas transistor M19 (here also an NFET) whose drain is closer to the output is controlled by a bias voltage nbias. During pull down, there is a small duration of time during which transistor M20 is not fully turned ON and thus transistor M19 would experience a higher voltage across its drain and source terminals. Similar to the stacked configuration of the upper half of driver 212, the drain of transistor M19 is coupled to the output node through resistor Rn. The use of resistor Rn reduces the transient Vds overshoot of transistor M19, thereby keeping the voltages across its terminals within reliability limits. In one embodiment, the resistors are roughly 100 Ohms. The resistor type chosen should have high current carrying capacity.

As discussed above, predriver 211 and driver 212 provide level shifting and output of data signals provided from host circuitry to interfaced peripheral circuitry. As shown in FIG. 2, mode control 214 and level detection 213 of the illustrated embodiment are utilized in output path 210 operation to facilitate operation of predriver 211 and driver 212 as described herein. Detail with respect to an embodiment of level detection 213 is shown in FIG. 7 and detail with respect to an embodiment of mode control 214 is shown in FIG. 8.

Figure 7:
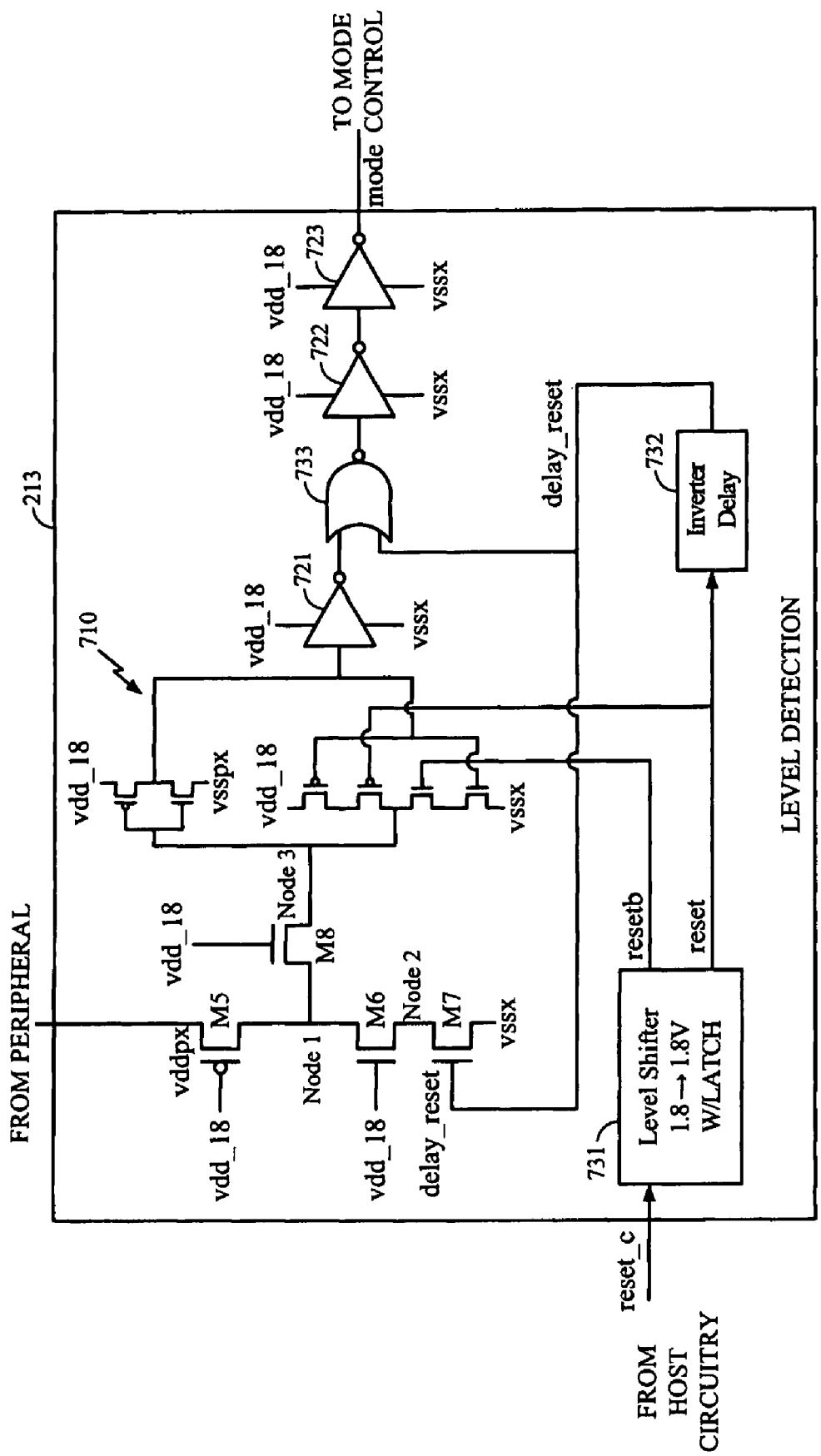
FIG. 7 shows detail with respect to an embodiment of a level detector as may be used in the high signal level compliant input/output circuitry of FIG. 2.
Figure 8:
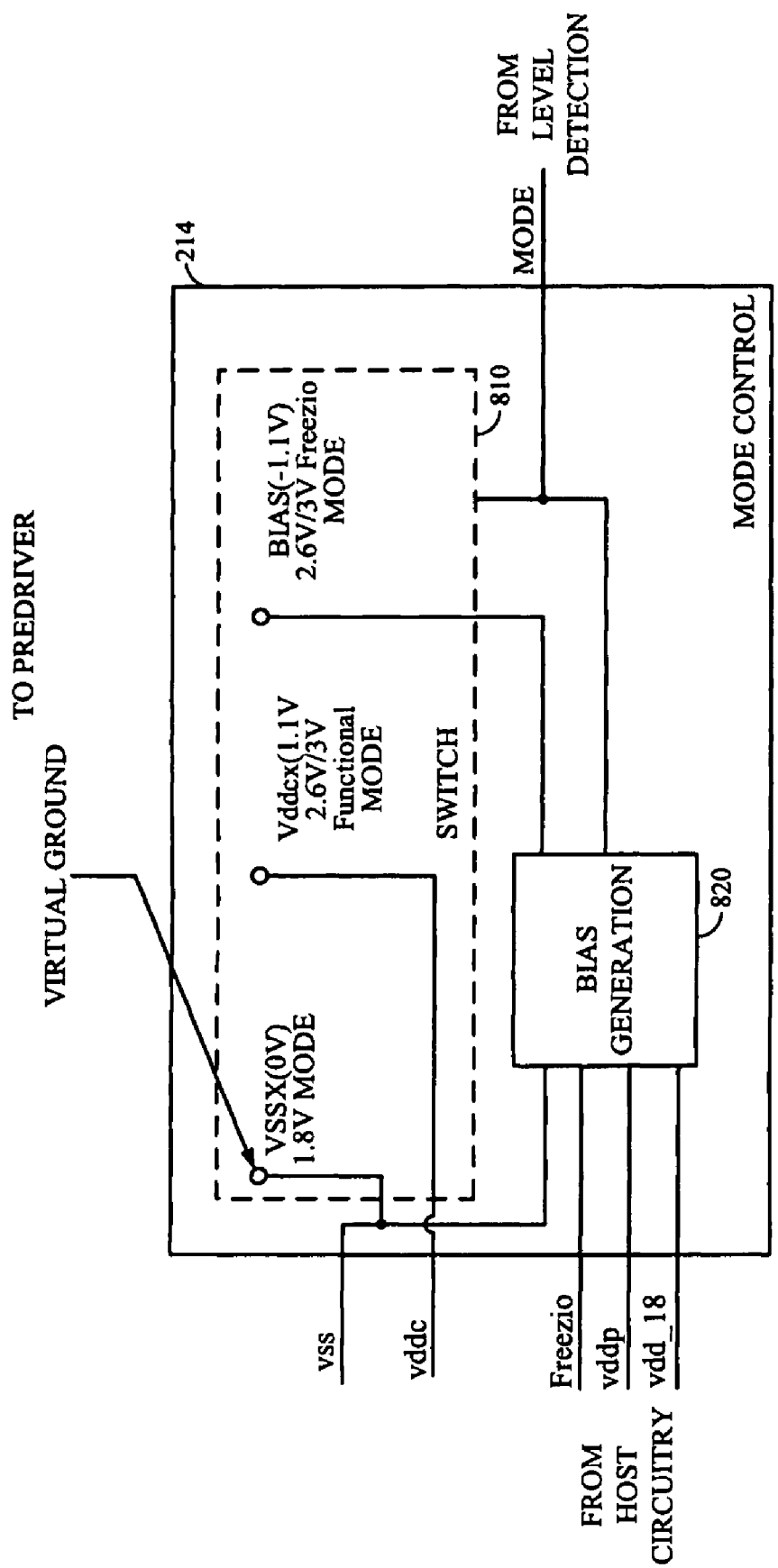
FIG. 8 shows detail with respect to an embodiment of a mode controller as may be used in the high signal level compliant input/output circuitry of FIG. 2.

Directing attention to FIG. 7, detail with respect to an embodiment of level detection 213 is shown. Level detection 213 provides versatile operation with respect to input/output circuit 200 in that input/output circuit 200 is operable to automatically and autonomously configure itself for operation with respect to an appropriate signal level using level detection 213. As shown in FIG. 7, level detection 213 is coupled to a peripheral for which interfacing is being provided to detect a signal level thereof and provide a signal or signals for controlling a mode of operation (e.g., 1.8V mode, 2.6V mode, or 3.0V mode) of input/output circuit 200. For example, level detection 213 of embodiments automatically detects the power supply voltage of the interfaced peripheral and causes circuitry of input/output circuit 200 to bias pad voltages accordingly. Accordingly, level detection 213 is able to automatically detect the voltage of an interfaced peripheral's power supply. Using such level detection circuitry, the use of external input or control for mode selection or, in the absence of mode selection, the use of separate input/output circuitry accommodating different signal levels can be avoided.

In facilitating automatic detection of signal levels, circuitry of level detection 213 is high signal level compliant (e.g., high voltage compliant). However, as discussed in further detail below, such high signal level compliance is provided using electronic devices which themselves are designed for use with lower signal levels according to the illustrated embodiment. Accordingly, although potentially having voltage levels ranging from 1.8V to 3.0V applied thereto, embodiments of transistors M5-M7 (shown here as FETs) comprise 1.8V transistors.

In operation, level detection 213 of the illustrated embodiment provides a digital signal level (mode) to various parts of input/output circuit 200 indicating the appropriate mode, thereby facilitating input/output circuit 200 functioning seamlessly irrespective of the signal level used by the particular peripheral interfaced thereto.

To better understand the operation of level detection 213 of the illustrated embodiment, assume that the voltage level the interfaced peripheral is operating at is 2.6V. Thus, vddp provided to transistor M5 is 2.6V. Assuming vdd_18 is 1.8V, transistor M5 is biased with a gate voltage of 1.8V which ensures that the gate to source voltage (Vgs) of this device is under reliable voltage levels, even where transistor M5 is designed to operate at 1.8V, because Vgs minus the threshold voltage (Vth) of transistor M5 is greater than Vth. This ensures that no two terminals of transistor M5 exceed the maximum voltage level acceptable for reliability. In the foregoing example (vddp is 2.6V) transistor M5 is turned ON and charges node 1 to vddp (2.6V). Transistor M5 is sized so that it is large enough so that when M5 is ON and M6 and M7 are also ON, the voltage at node 1 is vddp. In the case when the voltage level of the interfaced peripheral is 1.8V (or a voltage compatible with the host circuit), M5 is OFF because vddp is 1.8 and the bias voltage to M5 is 1.8. Thus, node 1 is pulled down to 0 by M6 and M6. In either case, a latch 710 latches a value (node 3) related to the value at node 1, as described below.

In the example when vddp is 2.6, transistor M6 sees a drain voltage of vddp (2.6V) at node 1. However, like transistor M5, the gate of transistor M6 is biased suitably (here biased with vdd_18) to ensure reliable voltages across its terminals. Whether transistor M7 is ON or OFF (depending upon the reset state discussed below), transistor M6 is ensured an acceptable voltage at node 2 because the transistor M6 is always ON and its gate is biased at 1.8V. Accordingly, the input stack of level detection 213 of the illustrated embodiment ensures that none of the transistors thereof experience voltages across their terminals which result in reliability issues.

As can be seen in FIG. 7, transistor M8 also has the drain thereof coupled to node 1, which is charged to 2.6V in the foregoing example. Because transistor M8 of the illustrated embodiment is an NFET, transistor M8 does not let node 3 charge to more than Vdd_18 (1.8V) minus the threshold voltage (Vth) of M8. This ensures acceptable voltages across the terminals of transistor M8. Moreover, as a result of the voltage drop at node 3 associated with transistor M8, none of the other electronic components of level detection 213 see a voltage greater than Vdd_18 (1.8V). From the above, it can be appreciated that the circuitry of level detection 213 of the illustrated embodiment is made high voltage tolerant by the component layout and by biasing the components appropriately.

High/low stack 710 provides latching of mode levels in accordance with the source voltage of transistor M8. For example, a high voltage (1.8V in the illustrated embodiment) is latched when vddp is detected to be 2.6V or 3.0V and a low voltage (0V in the illustrated embodiment) is latched when vddp is detected to be 1.8V. These values occur because transistor M8 controls node 3 to be Vdd_18 (1.8V) minus the threshold voltage (Vth). Buffers 721-723 of the illustrated embodiment operate to provide mode signal buffering to result in a mode control signal suitable for appropriately driving various components of input/output circuit 200.

Level shifter 731, inverter delay 732 and NOR gate 733 of the illustrated embodiment provide mode reset control according to an embodiment of level detection 213. Level shifter 731 may be comprised of level shifter circuitry such as that described above with respect to level shifters 311-313. Inverter delay 732 may be comprised of delay logic such as that described above with respect to programmable delay logic 411 and 421.

In operation according to embodiments, the reset signal provided by the host circuitry is level converted by level shifter 731 to the signal voltage used by input/output circuit 200 (in the foregoing example, vdd_1p8 (1.8V)) for use by circuitry of level detection 213. The configuration shown in FIG. 7 accommodates a reset signal going from high (1.1 V) to low (0 V) after all the host circuitry power supplies have been fully powered up and are stable, although other configurations may be used according to the concepts herein. Inverter delay 732 adds an amount of delay to facilitate detection of an appropriate mode and to then cause circuitry of level detection 213 to switch off to conserve power. Also, the delayed reset signal as provided by inverter delay 732 is used according to the illustrated embodiment to gate the mode control signal output, through NOR gate 733, to ensure that the mode control signal output is forced to 0 V (2.6-V mode) until the reset signal goes low. The foregoing gating is provided according to embodiments to ensure voltages across electronic device terminals of input/output circuit 200 which are within reliability limits for those electronic devices. The mode control signal is latched by latch 710 once the reset signal provided by the host circuitry goes low.

Directing attention to FIG. 8, detail with respect to an embodiment of mode control 214 is shown. According to embodiments, mode control 214 provides the correct value of "ground" to circuitry of input/output circuit 200 (e.g., buffers 331-335, level shifters 312 and 313, inverters 412 and 422, etc.) in order to facilitate voltages across electronic device terminals of input/output circuit 200 which are within reliability limits for those electronic devices to meet reliability limits.

During 1.8V mode (as indicated by the mode control signal provided by level detection 213), the value of virtual ground is switched to 0V (here vss) by switching circuitry 810 of the illustrated embodiment since the signal voltages are sufficiently low that reliability is not a concern. However, during 2.6V or 3.0V mode (again as indicated by the mode control signal), virtual ground of the illustrated embodiment is switched to the core voltage (here 1.1V) by switching circuitry 810 since the core voltage is sufficiently high to avoid voltages across terminals of the electronic components which exceed reliability limits.

Switching circuitry 810 of embodiments may be provided in various configurations. For example, solid state switching devices, such as FETs or the like may be used. Additionally or alternatively, mechanical switching mechanism may be utilized, if desired.

Mode control 214 of the illustrated embodiment is not only adapted to provide signal output consistent with a selected mode of operation, but is also adapted to maintain selection of a particular mode through a host circuitry power saving mode (e.g., sleep or freeze I/O mode), wherein one or more outputs of the host circuitry (e.g., power supply voltages) are unavailable to input/output circuit 200. In order to accommodate such power saving operation without resulting in an ambiguous state of input/output circuit operation, mode control 214 of the illustrated embodiment includes bias generation 820. Bias generation 820 of embodiments operates to generate a appropriate "virtual ground" level during periods of host circuitry power saving operation. That is, when one or more output of the host circuitry is unavailable due to power saving operation, bias generation 820 operates to internally generate appropriate control of predriver 211 and/or driver 212 to keep that circuitry latched in a selected low or high signal level state. Thus, when the host circuitry is returned to an operational state from power saving operation, input/output circuit 200 is configured to continue interfacing with the peripheral.

Figure 9:
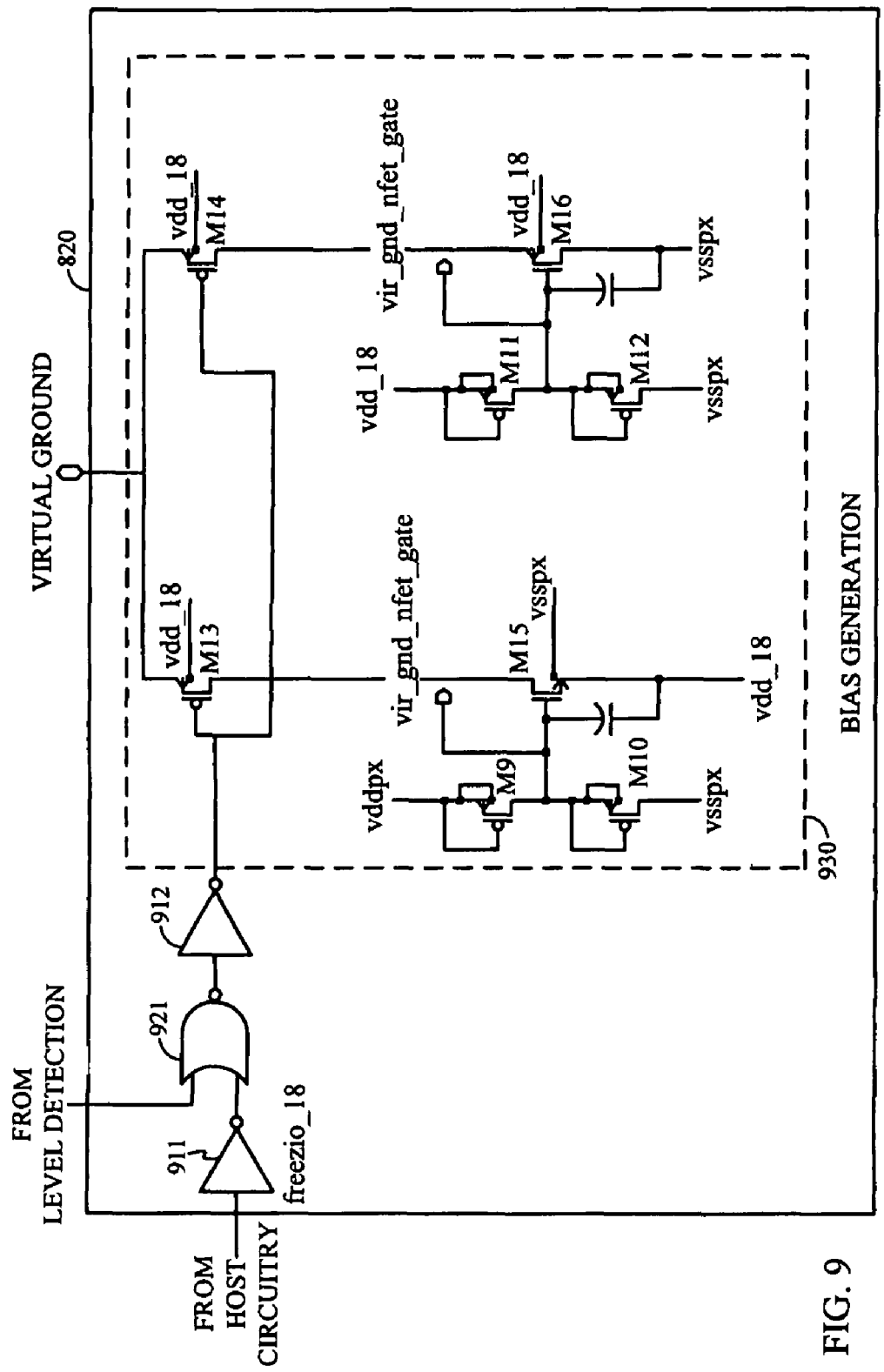
FIG. 9 shows detail with respect to an embodiment of a bias generator as may be used in the mode controller of FIG. 8.

Directing attention to FIG. 9, detail with respect to an embodiment of bias generation 820 is shown. In operation, power supply voltages provided by the host circuitry, such as the core voltage, collapse during power saving mode (as indicated by the freezio mode signal). Inverters 911 and 912 and NOR gate 921 cooperate to control circuitry of bias generation 820 to provide a bias during freeze I/O mode.

Bias generation according to the illustrated embodiment is provided by voltage divider 930 comprising OFF devices (shown here as transistors M9-M12 latched in an OFF state) operable to pull the voltages at nodes vir_grnd_nfet_gate and vir_gnd_pfet_gate to vddp (e.g., 2.6V) and vdd_18 (e.g., 1.8V). Transistors M13 and M14 are switched on by the output of inverters 911 and 912 and NOR gate 921, to thereby provide output at virtual ground which is the difference between the voltages of nodes vir_gnd_nfet_gate and vir_gnd_pfet_gate. According to embodiments, the virtual ground node is a relatively high impedance node and thus is not intended to function as a charge sink. Accordingly, all nodes that are to be held at a certain state during freeze I/O mode are expected to settle to their steady state values before the virtual ground bias of bias generation 820 is provided to them.

The bias provided by voltage divider 930 during high signal level mode (e.g., 2.6V or 3.0V mode), wherein the freeze I/O signal provided by the host circuitry in the illustrated embodiment is 1.1V, is approximately the core voltage (e.g., 1.1V). According to the illustrated embodiment, transistors M9 and M10 are PFETs disposed in a stacked configuration. Similarly, transistors M11 and M12 are PFETs disposed in a stacked configuration. The voltage provided to each of the foregoing stacks is, however, different. Specifically vddp (e.g., 2.6V) is provided to the gate of transistor M9 whereas vdd_18 (e.g., 1.8V) is provided to the gate of transistor M11. Using these transistors in the illustrated configuration (and the leakage associated with their OFF state), the difference in voltage at the gates of transistors M15 and M16 settles down to a voltage that is very close to 1.1V. If there is a noise event that draws current from or to the virtual ground node, then one of the FETs turns on once the voltage of the virtual ground node goes outside a certain range from the steady state condition. At this point the bias becomes a low-impedance bias and makes sure the node returns to steady state condition. This voltage is thus used, as provided at the virtual ground output to bias other circuits of input/output circuit 200 during host circuitry freeze I/O mode when input/output circuit 200 is operating in a high signal level mode.

In operation according to embodiments of mode control 214, bias generation is activated only when input/output circuit 200 is in a high signal level mode (e.g., 2.6V or 3.0V). Where input/output circuit 200 is in a low signal level mode (e.g., 1.8V), such as may be indicated by the mode control signal level from level detection 213, mode control 214 of embodiments operates to couple virtual ground to vss (here 0V), whether the host circuitry is in a freeze I/O mode or in an operating mode.

Although embodiments of level detection 213 and mode control 214 are described above to provide versatile operation of output path 210 wherein operation thereof is automatically and autonomously adjusted for high or low signal level processing, embodiments of input/output circuit 200 may utilize manual selection of modes. For example, switching circuitry 810 of embodiments may be manually controlled in accordance with a signal level of an interfaced peripheral, if desired.

Figure 10:
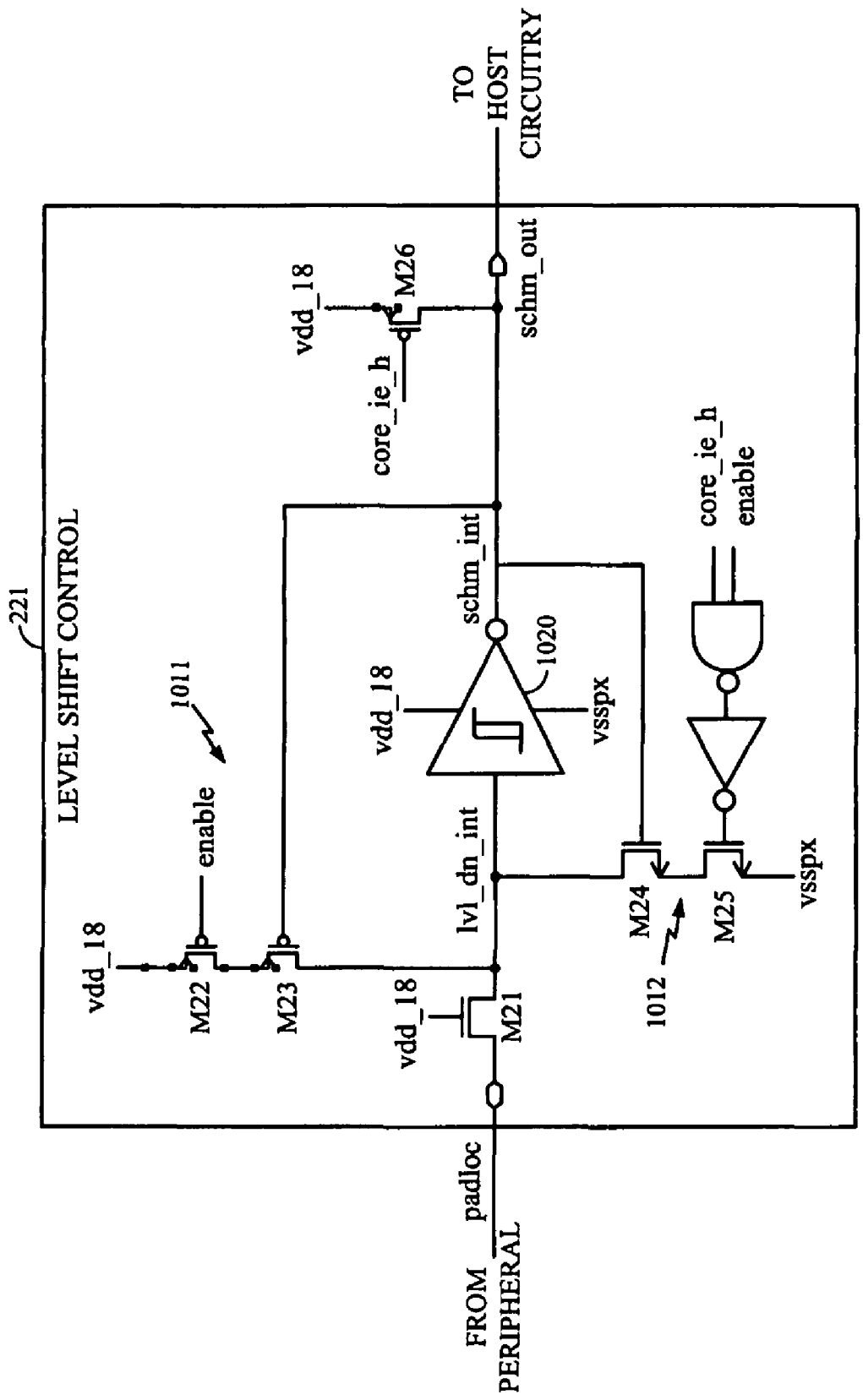
FIG. 10 shows detail with respect to an embodiment of a level shift controller as may be used in the high signal level compliant input/output circuitry of FIG. 2.

Having described detail with respect to functional blocks of output path 210 of embodiments, attention is directed to FIG. 10 wherein detail with respect to an embodiment of input path 221 is shown. In order to provide signal levels which are appropriate for the host circuitry, input path 220 of the illustrated embodiment includes level shift control 221. Similar to operation of level detection 213, level shift control preferably operates to accommodate input of both high and low level signals without resulting in voltages across terminals of the electronic components thereof exceeding reliability limits. In particular, although high signal levels (e.g., 2.6V and/or 3.0V) and low level signals (e.g., 1.8V) may be provided at the data input node of level shift control 221 labeled "padloc," level shift control 221 is configured to automatically accommodate such signals and provide a desired signal level (e.g., 1.8V) at the data output node labeled "schm_out."

In the high voltage compliant configuration of FIG. 10, always on NFET transistor M21, disposed in a passgate configuration, ensures that the electronic components of level shift control 221 do not see high voltage levels. More specifically, transistor M21 operates to bring the node labeled lvl_d-n_int down to 1.8-Vt. The first stage receiver, e.g., Schmitt trigger 1020 receives the 1.8-Vt signal and determines whether a 0 or 1 has been transmitted by the peripheral. Because the first stage receiver 1020 may be referenced to a different voltage than the input signal, it is important to have correct trip points. Pull up keeper circuitry 1011, comprised of transistors M22 and M23 (shown here as PFETs) in a stacked configuration, and pull down keeper circuitry 1012, comprised of transistors M24 and M25 (shown here as NFETs) in a stacked configuration, ensure that the input trip points (Vih, Vil) is met and that the signal level is referenced to the input path supply. The weak PFET keeper configuration of pull up keeper circuitry 1011 of the illustrated embodiment ensures the input to Schmitt trigger 1020 rises all the way to vdd_18 (1.8V) and shuts off any leakage. This ensures that this node rises quickly despite being driven by the NFET passgate of transistor M21. NFET pull down keeper circuitry 1012 voltage divides the rising edge and provides better trip points (Vil) on the rising edge of the signal. Such a configuration is particularly useful in achieving a good trip point in high signal level modes (e.g., 2.6V and/or 3.0V) because the input to level shift control 221 is at a higher voltage and the first stage of level shift control 221 is referenced to a lower voltage (e.g., 1.8V). Accordingly, the foregoing embodiment of level shift control 221 maintains desired trip points whether operating at high signal levels or low signal levels. In one embodiment, a core_ie_h signal is provided, along with an enable signal to enable the NFET keeper when receiving a high voltage signal. The enable signal is also provided to enable the PFET keeper when receiving a high voltage signal (e.g., 2.6V or 3.0V).

Transistor M26 of the illustrated embodiment is provided to facilitate disabling the peripheral input path. Specifically, providing an appropriate signal level to the node labeled "core_ie_h" (e.g., 1.8V) may be used to disable the output of level shift control 221, and thus disable input path 220.

Although various functional blocks have been described herein with reference to described embodiments, it should be appreciated that various circuitry an addition to or in the alternative to that described may be used in keeping with the concepts described herein. For example, ESD may be provided with respect to input/output circuit 200, such as to provide human body model (HBM) ESD protection at the data output of output path 210 and to provide charged device model (CDM) ESD protection at the data input of input path 220.

Moreover, circuit configurations different than those of the illustrated embodiments may be used in accordance with the concepts herein. For example, although various illustrated embodiments show a particular number of electronic components (e.g., FETs) disposed in a stacked configuration in order to accommodate the illustrative voltage levels described, different numbers of such electronic components may be used in such stacked configurations. For example, the stacked driver structure shown in FIG. 6 may utilize a stack of three FETs in the pdata (pull up) and/or ndata (pull down) driver stacks, such as where a higher signal level that discussed above is accommodated (e.g., 4.0V).

From the foregoing, it can be appreciated that input/output circuit 200 facilitates the use of electronic components designed for a lower signal level, such as 1.8V, and operated with a higher signal level, such as 2.6V or 3.0V. Accordingly, not only may a single input/output interface be used with respect to peripherals using different signal levels, but the input/output interface may use physically smaller and faster switching electronic components (e.g., 45 nm MOS, 1.8V electronic components). Moreover, embodiments described herein accommodate such different signal levels using a versatile operable to automatically and autonomously configure itself for operation with respect to an appropriate signal level.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A level shifter receiving an input signal and producing an output signal on an output path, the level shifter comprising:
   level detection circuitry coupled to the output path, the level detection circuitry operable to generate a mode selection signal in response to a signal level on the output path;
   mode control circuitry coupled to the level detection circuitry, the mode control circuitry operable to select a mode of operation in response to the mode selection signal;
   level shifting circuitry comprised of electronic components having signal level reliability limits less than a maximum signal level of the output; and
   a timing circuit coupled to said level shifting circuitry, said timing circuit operable to control a time of application of the input signal to said level shifting circuitry to prevent a signal level at one or more terminals of said electronic components from exceeding said signal level reliability limits
   wherein said level shifter operates to selectively shift a signal level of the input signal to a first signal level and a second signal level depending on said mode of operation, said second signal level being said maximum signal level of the output signal, and wherein said timing circuit. includes a mode selection input receiving the mode selection signal used to alter said time of application of said input signal in accordance with said mode of operation.

2. The level shifter of claim 1, wherein said electronic components comprise transistors.

3. The level shifter of claim 2, wherein said transistors are disposed in a stacked configuration.

4. The level shifter of claim 2, wherein said timing circuit comprises a delay disposed between an input of said level shifter and a gate of a transistor of said transistors to provide time delayed operation thereof.

5. The level shifter of claim 1, further comprising:
   additional level shifting circuitry, said additional level shifting circuitry comprised of additional electronic components having signal level reliability limits less than said maximum signal level of the output signal; and
   an additional timing circuit coupled to said additional level shifting circuitry, said additional timing circuit operable to control a time of application of said input signal to said additional level shifting circuitry to prevent a signal level of at least one terminal of said additional electronic components from exceeding said signal level reliability limits.

6. The level shifter of claim 1, wherein said first signal level is 1.8 volts or less and said second signal level is 2.6 volts or greater.

7. A level shifter comprising:
   level detection circuitry coupled to an output path of the level shifter, the level detection circuitry operable to generate a mode selection signal in response to a signal level on the output path;
   mode control circuitry coupled to the level detection circuitry, the mode control circuitry operable to select a mode of operation in response to the mode selection signal;
   level shifting circuitry operable to selectively shift a signal level of an input signal to a first signal level and a second signal level depending upon the mode of operation, wherein said first signal level is less than said second signal level, said level shifting circuitry comprising electronic components having signal level reliability limits less than said second signal level; and
   a timing circuit coupled to said level shifting circuitry and operable to control a time of application of an input signal to the level shifting circuitry to prevent a signal level of at least one terminal of said electronic components from exceeding said signal level reliability limits;
   wherein said timing circuit includes a mode selection input receiving the mode selection signal used to alter said time of application of said input signal in accordance with said mode of operation.

8. The level shifter of claim 7, wherein said level shifting circuitry comprises:
   a pull down circuit comprised of said electronic components, said timing circuit coupled to an input of said pull down circuit.

9. The level shifter of claim 7, wherein said level shifting circuitry comprises:
   a pull up circuit comprised of said electronic components, said timing circuit coupled to an input of said pull up circuit.

10. The level shifter of claim 7, wherein said level shifting circuitry comprises:
    a pull down circuit; and
    a pull up circuit, wherein said pull down circuit and said pull up circuit are comprised of said electronic components, and wherein said timing circuit is coupled to an input of said pull down circuit and to an input of said pull up circuit.

11. The level shifter of claim 10, wherein said electronic components comprise transistors.

12. The level shifter of claim 11, wherein transistors of said pull up circuit are disposed in a stacked configuration and transistors of said pull down circuit are disposed in a stacked configuration.

13. The level shifter of claim 11, wherein said first signal level is 1.8 volts or less and said second signal level is 2.6 volts or greater.

14. A method comprising:
    providing level shifting circuitry operable to selectively shift a signal level of an input signal to a first signal level and a second signal level depending upon a mode of operation, wherein said first signal level is less than said second signal level, said circuitry comprising electronic components having signal level reliability limits less than said second signal level;

coupling level detection circuitry to an output path of the level shifting circuitry, the level detection circuitry operable to generate a mode selection signal in response to a signal level on the output path;

coupling mode control circuitry to the level detection circuitry, the mode control circuitry operable to select a mode of operation in response to the mode selection signal;

coupling a timing circuit to said level shifting circuitry; and adapting said tinting circuit to control a time of application of an input signal to the level shifting circuitry to prevent a signal level at one or more terminals of said electronic components from exceeding said signal level reliability limits;

wherein said timing circuit includes a mode selection input receiving the mode selection signal used to alter said time of application of said input signal in accordance with said mode of operation.

15. The method of claim 14, wherein said providing level shifting circuitry comprises:

providing a pull down circuit; and providing a pull up circuit, wherein said pull down circuit and said pull up circuit are comprised of said electronic components.

16. The method of claim 15, wherein said coupling said timing circuit to said level shifting circuitry comprises:

coupling said timing circuit to an input of said pull down circuit; and coupling said timing circuit to an input of said pull up circuit.

17. The method of claim 15, wherein said electronic components comprise transistors.

18. The method of claim 17, wherein said providing said pull down circuit comprises:

disposing said transistors of said pull down circuit in a stacked configuration.

19. The method of claim 18, wherein said providing said pull up circuit comprises:

disposing said transistors of said pull up circuit in a stacked configuration.

20. A level shifter receiving an input signal and producing an output signal on an output path, the level shifter comprising:

means for generating a mode selection signal in response to a signal level on the output path, the mode selection signal generating means being coupled to the output path;

means for selecting a mode of operation in response to the mode selection signal, the selecting means being coupled to the mode selection signal generating means;

means for level shifting the input signal, the level shifting means comprising means for processing electronic signals, the processing means having signal level reliability limits less than a maximum signal level of the output; and means for controlling a time of application of the input signal to the level shifting means to prevent a signal level of at least one terminal of the processing means from exceeding the signal level reliability limits, the controlling means being coupled to the level shilling means;

in which the level shifter operates to selectively shift a signal level of the input signal to a first signal level and a second signal level depending on the mode of operation, the second signal level being the maximum signal level of the output signal, and in which the controlling means includes a mode selection input receiving the mode selection signal used to alter the time of application of the input signal in accordance with the mode of operation.

21. A level shifter comprising:

means for generating a mode selection signal in response to a signal level on the output path, the generating means being coupled to an output path of the level shifter;

means for selecting a mode of operation in response to the mode selection signal, the selecting means being coupled to the mode selection signal generating means;

means for selectively shifting a signal level of an input signal to a first signal level and a second signal level depending upon the mode of operation, the first signal level being less than the second signal level, the level shifting means comprising a means for processing electronic signals, the processing means having signal level reliability limits less than the second signal level; and means for controlling a time of application of the input signal to control the time of application of the input signal to the level shifting means to prevent a signal level of at least one terminal of the processing means from exceeding the signal level reliability limits, the controlling means being coupled to the level shilling means;

in which the controlling means includes a mode selection input receiving the mode selection signal used to alter the time of application of the input signal in accordance with the mode of operation.

* * * * *